(12) United States Patent
Otremba et al.

(10) Patent No.: US 9,048,838 B2
(45) Date of Patent: Jun. 2, 2015

(54) SWITCHING CIRCUIT

(71) Applicant: Infineon Technologies Austria AG, Villach (AT)

(72) Inventors: Ralf Otremba, Kaufbeuren (DE); Klaus Schiess, Allensbach (DE); Rainald Sander, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/067,378

(22) Filed: Oct. 30, 2013

(65) Prior Publication Data
US 2015/0116025 A1 Apr. 30, 2015

(51) Int. Cl.
*H03K 17/687* (2006.01)

(52) U.S. Cl.
CPC ...... *H03K 17/687* (2013.01); *H03K 2017/6875* (2013.01)

(58) Field of Classification Search
USPC ................................. 327/434, 437
See application file for complete search history.

(56) References Cited

U.S. PATENT DOCUMENTS

| | | | |
|---|---|---|---|
| 4,093,875 A * | 6/1978 | Knepper | 327/434 |
| 4,908,682 A | 3/1990 | Takahashi | |
| 5,025,298 A | 6/1991 | Fay et al. | |
| 5,034,796 A | 7/1991 | Zommer | |
| 5,079,608 A | 1/1992 | Wodarczyk et al. | |
| 5,153,696 A | 10/1992 | Kayama | |
| 5,422,593 A | 6/1995 | Fujihira | |
| 5,726,481 A | 3/1998 | Moody | |
| 6,084,462 A | 7/2000 | Barker | |
| 6,791,810 B2 | 9/2004 | Nakamura et al. | |
| 7,038,525 B2 * | 5/2006 | Kato | 327/437 |
| 7,122,882 B2 | 10/2006 | Lui et al. | |
| 7,288,803 B2 | 10/2007 | Beach et al. | |
| 7,501,670 B2 | 3/2009 | Murphy | |
| 7,719,055 B1 | 5/2010 | McNutt et al. | |
| 7,777,553 B2 | 8/2010 | Friedrichs | |
| 7,782,099 B2 | 8/2010 | Kawamura | |
| 7,915,645 B2 | 3/2011 | Briere | |
| 8,017,978 B2 | 9/2011 | Lidow et al. | |
| 8,368,120 B2 | 2/2013 | Lidow et al. | |
| 2004/0130037 A1 * | 7/2004 | Mishra et al. | 257/778 |
| 2006/0002154 A1 * | 1/2006 | Amrani et al. | 363/16 |

(Continued)

FOREIGN PATENT DOCUMENTS

DE 19610135 C1 6/1997
DE 102004041886 B4 3/2006

(Continued)

OTHER PUBLICATIONS

Unknown, Author. "Power MOSFET Basics" Application Notes MOS-007. Date unknown. pp. 1-10. Alpha & Omega Semiconductor. Accessed at: <http://www.aosmd.com/applications/notes/mosfets>.

(Continued)

*Primary Examiner* — Adam Houston
(74) *Attorney, Agent, or Firm* — Murphy, Bilak & Homiller, PLLC

(57) ABSTRACT

In an embodiment, a switching circuit includes input drain, source and gate nodes, a high voltage depletion mode transistor including a current path coupled in series with a current path of a low voltage enhancement mode transistor, and a current sense circuit for sensing the current flowing through a current sense path.

29 Claims, 5 Drawing Sheets

(56) References Cited

U.S. PATENT DOCUMENTS

| | | |
|---|---|---|
| 2006/0018172 A1* | 1/2006 | Kuroda et al. ............... 365/210 |
| 2006/0193173 A1* | 8/2006 | Iwahashi ................ 365/185.07 |
| 2007/0171692 A1* | 7/2007 | Kuroda et al. ................ 365/96 |
| 2009/0321787 A1* | 12/2009 | Murphy et al. .............. 257/194 |
| 2011/0309372 A1 | 12/2011 | Xin et al. |
| 2011/0316045 A1* | 12/2011 | Liu et al. ..................... 257/192 |
| 2012/0262220 A1 | 10/2012 | Springett |
| 2012/0271991 A1* | 10/2012 | Allen et al. .................. 711/103 |
| 2012/0275253 A1* | 11/2012 | Ferrant et al. ............... 365/203 |
| 2012/0292635 A1 | 11/2012 | Iketani et al. |
| 2014/0159119 A1* | 6/2014 | Derluyn et al. .............. 257/194 |
| 2014/0210519 A1* | 7/2014 | Ribarich ........................ 327/98 |
| 2014/0225163 A1* | 8/2014 | Briere ........................ 257/195 |
| 2014/0227983 A1* | 8/2014 | Clausen et al. ................ 455/78 |
| 2014/0253218 A1* | 9/2014 | Dix et al. ..................... 327/434 |
| 2014/0264454 A1* | 9/2014 | Banerjee et al. ............. 257/194 |
| 2014/0375242 A1* | 12/2014 | Briere ......................... 318/494 |
| 2015/0035568 A1 | 2/2015 | Peng et al. |
| 2015/0035586 A1 | 2/2015 | Weis et al. |

FOREIGN PATENT DOCUMENTS

| | | |
|---|---|---|
| DE | 102005034012 A1 | 11/2006 |
| EP | 0224274 A2 | 6/1987 |
| EP | 0409214 A2 | 1/1991 |
| EP | 0414499 A2 | 2/1991 |
| EP | 0488088 A1 | 6/1992 |
| EP | 0409214 B1 | 12/1995 |

OTHER PUBLICATIONS

Clemente, S., et al.—"An Introduction to the HEXSense Current-Sensing Device." 1986, pp. 1-6, AN-959, International Rectifier, El Segundo, California, USA.

Unknown, Author, "Current Protection and Measurement." Application Note 2015, May 1, 2009, pp. 1-13, Zilker Labs, Austin, USA.

Unknown, Author, "A Simple Current-Sense Technique Eliminating a Sense Resistor." Application Note 7, Jul. 1998, pp. 1-6, Rev 1.1, LinFinity Microelectronics.

Munson, J., et al. "Current Sense Circuit Collection." Application Note 105, Dec. 2005, pp. 1-76, Linear Technology.

Unknown, Author, " Current Sensing Power MOSFETS," Application Note 10322, Jun. 24, 2009, pp. 1-10, Rev. 2.24, NXP Semiconductors.

Pandya, K., "Current-Sensing Power MOSFETs," Application Note 606, Dec. 17, 2003, pp. 1-4, Document No. 71991, Vishay Siliconix.

Pandya, K., "Temperature Sensing Power MOSFET," Application Note 820, Jul. 13, 2001, pp. 1-6, Document No. 71621, Vishay Siliconix.

Starks, A., "Using SENSEFET with CAT2300 in Load Switch Applications," Application Note 9039/d, Aug. 2011, pp. 1-5, On Semiconductor.

Zaremba, D., "Low-Side Self-Protected MOSFET." Application Note 8202/D, Feb. 2011, pp. 1-13, Rev. 1, On Semiconductor.

* cited by examiner

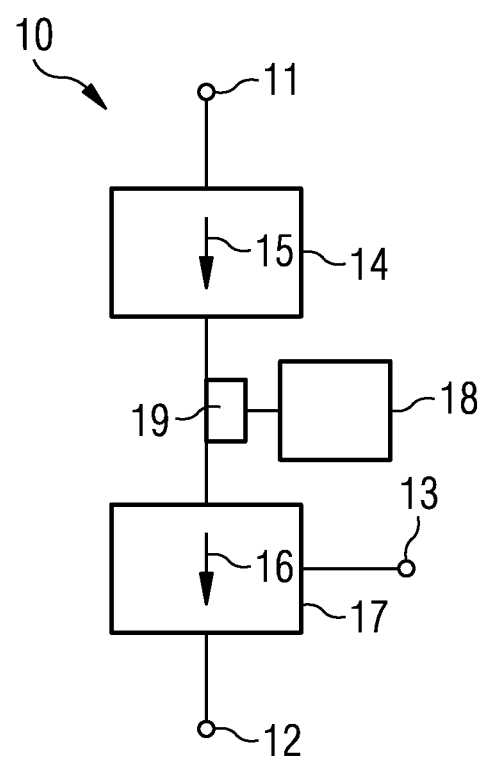

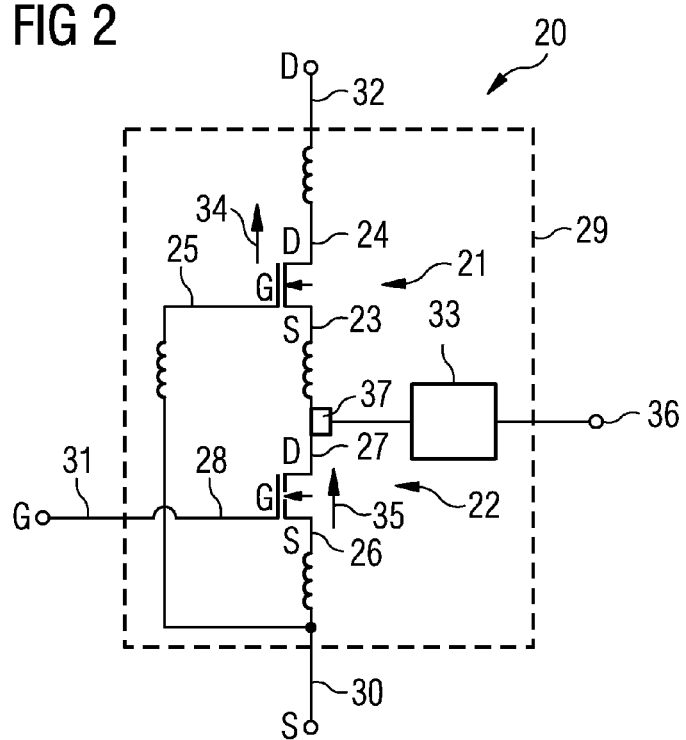
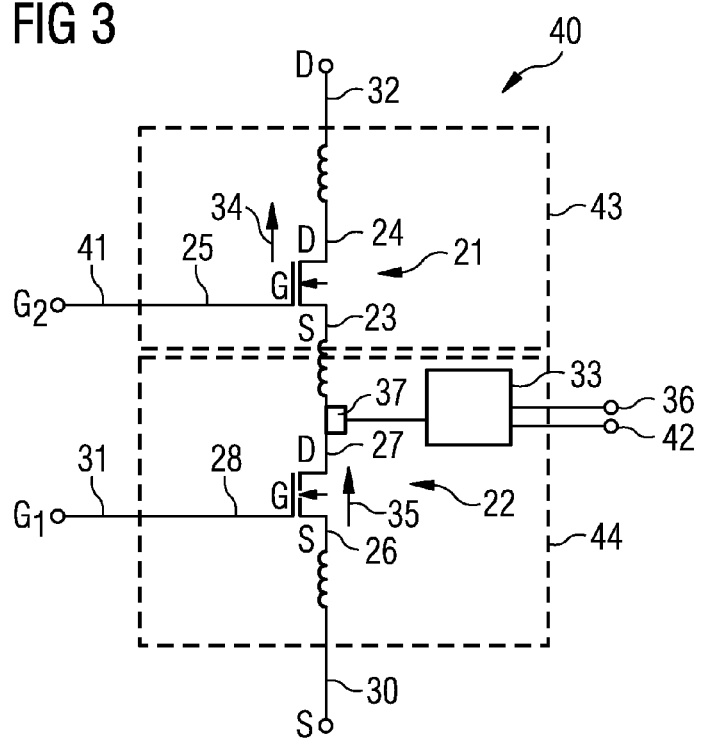

SWITCHING CIRCUIT

BACKGROUND

To date, transistors used in power electronic applications have typically been fabricated with silicon (Si) semiconductor materials. Common transistor devices for power applications include Si CoolMOS, Si Power MOSFETs, and Si Insulated Gate Bipolar Transistors (IGBTs). Compound semiconductors, for example III-V compound semiconductors such as GaAs are also useful in some applications. More recently, silicon carbide (SiC) power devices have been considered. Group III-N semiconductor devices, such as gallium nitride (GaN) devices, are now emerging as attractive candidates to carry large currents, support high voltages and to provide very low on-resistance and fast switching times.

SUMMARY

In an embodiment, a switching circuit includes input drain, source and gate nodes, a high voltage depletion mode transistor including a current path coupled in series with a current path of a low voltage enhancement mode transistor, and a current sense circuit for sensing the current flowing through a current sense path.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1 illustrates a switching circuit according to an embodiment.

FIG. 2 illustrates a schematic diagram of a switching circuit including a cascode arrangement.

FIG. 3 illustrates a schematic diagram of a switching circuit.

DETAILED DESCRIPTION

Figure 4:
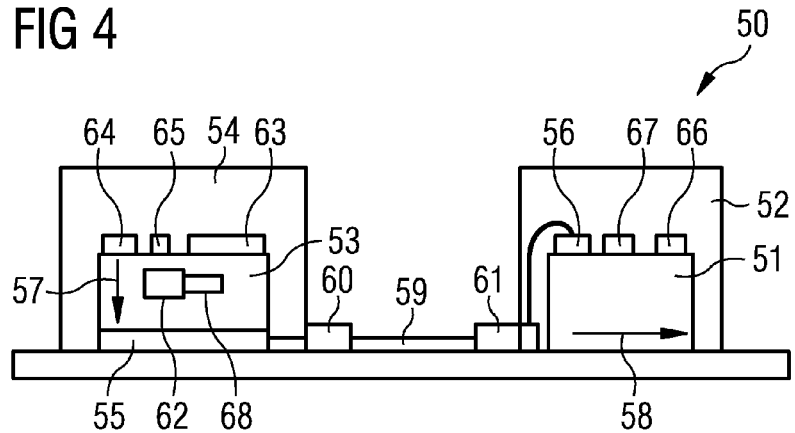
FIG. 4 illustrates a switching circuit including two packages according to an embodiment.

In the following detailed description, reference is made to the accompanying drawings, which form a part hereof, an in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

As employed in this specification, the terms "coupled" and/or "electrically coupled" are not meant to mean that the elements must be directly coupled together-intervening elements may be provided between the "coupled" or "electrically coupled" elements.

A depletion-mode device, such as a high-voltage depletion-mode transistor, has a negative threshold voltage which means that it can conduct current at zero gate voltage. These devices are normally on. And enhancement-mode device, such as a low-voltage enhancement-mode transistor, has a positive threshold voltage which means that it cannot conduct current at zero gate voltage and is normally off.

As used herein, a "high-voltage device", such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the switching circuit for which it is used. A high-voltage device may be capable of blocking 300 V, 600 V, 1200 V, or other suitable blocking voltage required by the application.

As used herein, a "low-voltage device", such as a low-voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

As used herein, a compound semiconductor device may include any suitable semiconductor material that forms a field-effect transistor (FET) such as an insulated-gate FET (IGFET), or a high electron mobility transistor (HEMT), for example. Suitable semiconductor materials include compound semiconductor materials such as SiGe, SiC, and group III-V materials including group III-Arsenide, group III-Phosphide, group III-Nitride or any of their alloys. Therefore, the phrase "group III-V" refers to a compound semiconductor that includes a group V element and at least one group III element. Moreover, the phrase "group III-Nitride" refers to a compound semiconductor that includes nitrogen (N) and at least one group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aP_bN_{(1-a-b)}$) for example. Group III-Nitride also refers generally to any polarity including but not limited to Ga-polar, N-polar, semi-polar or non-polar crystal orientations.

Aluminum gallium nitride refers to an alloy described by the formula $Al_xGa_{(1-x)}N$, where x>1.

These semiconductor materials are semiconductor compounds that have a relatively wide, direct bandgap, and have high critical breakdown fields, high saturation drift velocity and good thermal conductivity. As a result, III-Nitride materials such as GaN are used in many microelectronic applications in which high power density and high efficiency switching are required.

FIG. 1 illustrates a switching circuit 10 according to an embodiment. The switching circuit 10 includes an input drain node 11, an input source node 12, an input gate node 13, a high-voltage depletion mode transistor 14 including a current path 15 coupled in series with a current path 16 of a low voltage enhancement mode transistor 17. The switching circuit further includes a current sense circuit 18 for sensing the current flowing through a current sense path 19.

The current sense circuit 18 may be used to sense the current flowing through the current sense path 19. The current flowing through the current path of the switching circuit 10 can be inferred from the current flowing through the current sense path 19. The current sense path 19 may be arranged in parallel with the current path of the switching circuit 10.

The current sense circuit 18 and/or current sense path 19 may be at least partially integrated in the high-voltage depletion mode transistor 14 or in the low voltage enhancement mode transistor 17 since the current path 15 of the high voltage depletion mode transistor 14 is coupled in series with the current path 16 of the low voltage enhancement mode transistor 17.

The current sense circuit 18 including the current sense path 19 may include a transistor coupled in parallel with the low voltage enhancement mode transistor 17. The low voltage enhancement mode transistor 17 may include a plurality of transistor cells connected in parallel with each other and integrated in a semiconductor substrate. The current sense circuit 18 may include a current sense element that includes one of these transistor cells or a predetermined number of these transistor cells coupled in parallel. The transistor cells may have source electrodes.

The current sense circuit 18 may further include a first current sense pad on the semiconductor substrate that is coupled to the source electrodes of the transistor cells constituting the current sense element. The current sense circuit 18 may further include a second current sense pad on the semiconductor substrate which is coupled to the source electrode of the low voltage enhancement mode transistor. The second current sense pad may be separate from the first current sense pad. The current sense circuit 18 may further include a resistive element coupled between the first current sense pad and the second current sense pad.

In addition to the input drain node, the input source node and the input gate node, the switching circuit 10 may include at least one current sense node and, in one embodiment, a first current sense node and second current sense node. The switching circuit 10 may also include a second gate node.

The high-voltage mode depletion transistor 14 may be operatively connected in a cascode arrangement to the low voltage enhancement mode transistor 17.

In an embodiment, the high-voltage depletion mode transistor 14 is directly driven.

The high-voltage depletion mode transistor 14 and the low voltage enhancement mode transistor 17 may have different arrangements.

In an embodiment, the high voltage depletion mode transistor 14 may be provided as a discrete component and the low voltage enhancement mode transistor 17 may be provided as a discrete component.

In an embodiment, the high-voltage depletion mode transistor and the low voltage enhancement mode transistor are mounted adjacent one another in a composite package.

The high-voltage depletion mode transistor 14 and the low voltage enhancement mode transistor 17 may be monolithically integrated.

The high-voltage depletion mode transistor 14 may be a Group III nitride-based transistor or a Group III nitride-based high electron mobility transistor (HEMT).

The low voltage enhancement mode transistor 17 may be an IGFET (Insulated Gate Field Effect Transistor), for example a p-channel MOSFET.

The high voltage depletion mode transistor 14 of the switching circuit 10 is, in operation, normally on. In embodiments in which it is desirable that the high voltage depletion mode transistor 14 is normally off, this may be achieved by operatively connecting the high voltage depletion mode transistor 14 in a cascode arrangement to the low voltage enhancement mode transistor 17.

FIG. 2 illustrates a schematic diagram of a switching circuit 30 including such a cascode arrangement.

In the switching circuit 20, a high voltage depletion-mode transistor 21, which is normally on, is combined with a low voltage enhancement-mode transistor 22, which is normally off, to form a hybrid device which is normally off.

The high voltage depletion-mode transistor 21 includes a source 23, a drain 24 and a gate 25. The low voltage enhancement-mode transistor 22 also includes a source 26, a drain 27 and a gate 28.

The source 23 of the high voltage depletion-mode transistor 21 is electrically coupled to the drain 27 of the low voltage enhancement-mode transistor 22. The gate 25 of the high voltage depletion-mode transistor 21 is electrically coupled with the source 26 of the low voltage enhancement-mode transistor 22 in a cascode configuration.

The high voltage depletion-mode transistor 21 and the low voltage enhancement-mode transistor 22 may be provided in a single package or in a composite semiconductor body, illustrated schematically in FIG. 2 with a dotted line 29.

The switching circuit includes an input source node 30, an input gate node 31 and an input drain node 32. The source node 30 may be denoted as a low voltage lead and the drain node 32 may be denoted as a high voltage lead. In the example illustrated in FIG. 2, 0 V may be applied to the low voltage lead 40 and 600 V to the high voltage lead 32.

The source 26 of the low voltage enhancement-mode transistor 22 and the gate 25 of the high voltage depletion-mode transistor 21 are both electrically coupled to the source node 30. The gate 28 of the low voltage enhancement-mode transistor 22 is electrically coupled to the gate node 31 and may be driven by a gate driver circuit coupled to the gate node 31. The drain 24 of the high voltage depletion-mode transistor 22 is electrically coupled to the drain node 22.

The switching circuit 20 further includes a current sense circuit 33 for sensing the current flowing through the switching circuit 20. The current sense circuit 33 may sense the current flowing through the current path 34 in the low voltage enhancement mode transistor 22 or may sense the current flowing through the current path 35 in the high-voltage depletion mode transistor 21.

In particular, the current sense circuit 33 is used to sense the current flowing through a current sense path 37 which is arranged in parallel with the current path the 34 of the low voltage enhancement mode transistor 22 or in parallel with the current path 35 of the high-voltage depletion mode transistor 21. The current sense circuit 33 is coupled to a sense node 36 of the switching circuit 20.

FIG. 3 illustrates a schematic diagram of a switching circuit 40 in which the gate 25 of the high voltage depletion-mode transistor 21 is directly driven, rather than being electrically coupled with the source 25 of the low voltage enhancement-mode transistor 22 in a cascode configuration in order to provide a hybrid normally off switching circuit 40.

The switching circuit 40 further includes a second gate node 41 that is electrically coupled to the gate 25 of the high voltage depletion-mode transistor 21. The gate 25 is directly controlled by use of the second gate node 41. The switching circuit 40 further includes a second sense node 42 which is coupled to the sense circuit 33.

The switching circuit 40 may be provided by two discrete components indicated with the dotted lines 43 and 44 in FIG. 3. The components 43, 44 may be provided by separate semiconductor packages or by separate semiconductor transistor devices mounted in a common package to provide a composite package. In the switching circuit 40 illustrated in FIG. 3, the current sense circuit 33 and current sense path 37 is associated with the low voltage enhancement mode transistor 22 and may be monolithically integrated in the low voltage enhancement mode transistor 22. However, the switching circuit 40 is not limited to such arrangements and the circuit current sense circuit 33 may be associated with the high-voltage depletion mode transistor 31 and may be monolithically integrated in the high-voltage depletion mode transistor 21.

As discussed above, the switching circuit may be formed by a high-voltage depletion mode transistor and a low voltage enhancement mode transistor having various arrangements.

FIG. 4 illustrates a switching circuit 50 according to an embodiment in which the high voltage depletion mode transistor 51 is provided in a first package 52 and the low voltage enhancement mode transistor 53 is provided in a second package 54 which is separate from the first package 52.

The low voltage enhancement mode transistor 53 is a vertical MOSFET device including a drain pad 55 on its lower surface and a source pad 63, a gate pad 64 and a sense pad 65 on its upper surface.

The high-voltage depletion mode transistor 51 is a gallium nitride-based HEMT and includes a source pad 56, a gate pad 67 and a drain pad 66 on its upper surface.

The drain pad 55 of the low voltage enhancement mode transistor 53 is electrically coupled to the source pad 56 of the high-voltage depletion mode transistor 51 in order to couple the current path 57 of the low voltage enhancement mode transistor 53 in series with the current path 58 of the high-voltage depletion mode transistor 51.

A conductive connector 59 may be used to couple an outer contact 60 of the second package 54, which is coupled to the drain pad 55 of the low voltage enhancement mode transistor 53, to an outer contact 61 of the second package 52, which is coupled to the source pad 56 of the high voltage depletion mode transistor 51. The conductive connector 59 is positioned outside of the two packages 52, 54. The conductive connector 59 may be provided by a conductive trace of a circuit board, for example. The switching circuit 50 further includes a current sense circuit 62 including a current sense path 68 which, in the embodiment illustrated in FIG. 4, is monolithically integrated in the low voltage enhancement mode transistor 53.

Forming the switching circuit 50 using a discrete package 54 for the low voltage enhancement mode transistor 53 and a separate, discrete package 52 for the high-voltage depletion mode transistor 51 may enable the use of standard components to be coupled together to form the switching circuit 50.

The gate pad 67 of the high-voltage depletion mode transistor is coupled to the source pad 63 of the low voltage enhancement mode transistor in a cascode configuration. The switching circuit 50 includes an input source node which is coupled to the source 63 of the low voltage enhancement mode transistor 53, an input drain node which is coupled to the drain pad 66 of the high-voltage depletion mode transistor, a gate node which is electrically coupled to the gate pad 64 of the low voltage enhancement mode transistor 53 and a sense node which is electrically coupled to the sense pad 65 of the current sense circuit 62.

The current sense circuit 62 may be used to directly sense the current flowing through the current sense path 68 which is arranged in parallel to the current path 57 in the low voltage enhancement mode transistor 53. The current flowing in the current path 57 can be inferred from the sensed current flowing through the current sense path 68. If the current sense circuit 62 detects that the current flowing in the current path 57 has exceeded a predetermined threshold, this may mean that the low voltage enhancement mode transistor 53 and/or the high voltage depletion mode transistor 51 may be about to suffer a fault or is faulting. This information may be used to switch off the switching circuit 50.

Figure 5:
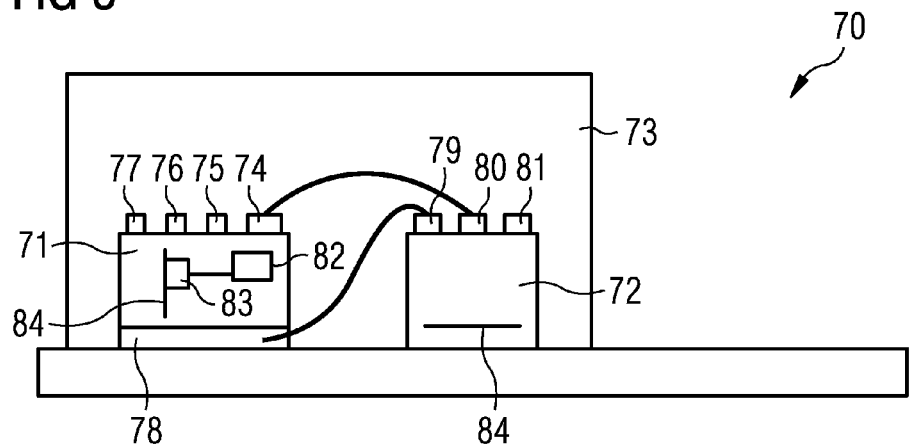
FIG. 5 illustrates a switching circuit including a single composite package according to an embodiment.

FIG. 5 illustrates a switching circuit 70 according to an embodiment. The switching circuit 70 includes a low voltage enhancement mode transistor 71 in the form of a vertical MOSFET and a high-voltage depletion mode transistor 72 in the form of the gallium nitride-based HEMT which are arranged adjacent one another within a common package 73 to form a composite package.

The low voltage enhancement mode transistor 71 includes a source pad 74, a gate pad 75, a sense pad 76 and a Kelvin pad 77 on its upper surface and a drain pad 78 on its lower surface. The high-voltage depletion mode transistor includes a source pad 79, a gate pad 80 and a drain pad 81 on its upper surface.

The drain pad 78 of the low voltage enhancement mode transistor 71 is electrically coupled to the source pad 79 of the high-voltage depletion mode transistor 72 and the gate pad 80 of the high-voltage depletion mode transistor 72 is electrically coupled to the source pad 74 of the low voltage enhancement mode transistor 71 in a cascode configuration.

The composite package 73 includes a source node which is electrically coupled to the source pad 74 of the low voltage enhancement mode transistor 71, a drain node which is electrically coupled to the drain pad 81 of the high-voltage depletion mode transistor 72, a gate node which is electrically coupled to the gate pad 75 of the low voltage enhancement mode transistor 71, a sense node electrically coupled to the sense pad 76 and a Kelvin node which is electrically coupled to the Kelvin pad 77.

The composite package 73 and, therefore, the switching circuit 70 further includes a current sense circuit 82 for sensing the current flowing in a current sense path 83 of the low voltage enhancement mode transistor 72 and, therefore, indirectly in a current path 84 of the switching circuit 70 as the drain pad 78 of the low voltage enhancement mode transistor 71 is electrically coupled in series to the source pad 79 of the high-voltage depletion mode transistor 72.

The current sense circuit 82 including the current sense path 83 may be arranged at least partially in the low voltage enhancement mode transistor 71 or at least partially in the high-voltage depletion mode transistor 72.

If the current sense circuit 82 detects that the current flowing in the current path 83 has exceeded a predetermined threshold, this may mean that the low voltage enhancement mode transistor 71 and/or the high voltage depletion mode transistor 72 may be about to suffer a fault or is faulting. This information may be used to switch off the switching circuit 80. Since the low voltage enhancement mode transistor 71, the high voltage depletion mode transistor 72 and the current sense circuit 82 are arranged in a composite package, the composite package can be considered to include a normally off hybrid device including a current sense function.

Figure 6:
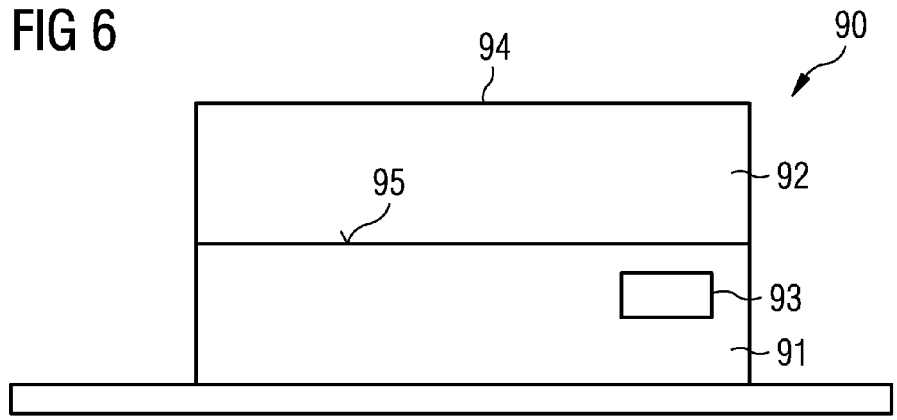
FIG. 6 illustrates a monolithically integrated switching circuit according to an embodiment.

FIG. 6 illustrates a switching circuit 90 according to an embodiment which includes a low voltage enhancement mode transistor 91 in the form of a silicon-based MOSFET device and a high-voltage depletion mode transistor 92 in the form of a gallium nitride-based HEMT and a current sense circuit 93.

In this embodiment, the low voltage enhancement mode transistor 91 and the high-voltage depletion mode transistor 92 are monolithically integrated to form a composite component 94.

The silicon-based low voltage enhancement mode transistor 91 may be used as a substrate for the subsequent deposition of the high-voltage depletion mode transistor 92. The electrical connection between the drain pad of the low voltage enhancement mode transistor 91 and the source of the high-voltage depletion mode transistor 92 required by the switching circuit 90 may be provided at the interface 95 between the low voltage enhancement transistor 91 and the high-voltage depletion mode transistor 92.

Figure 7:
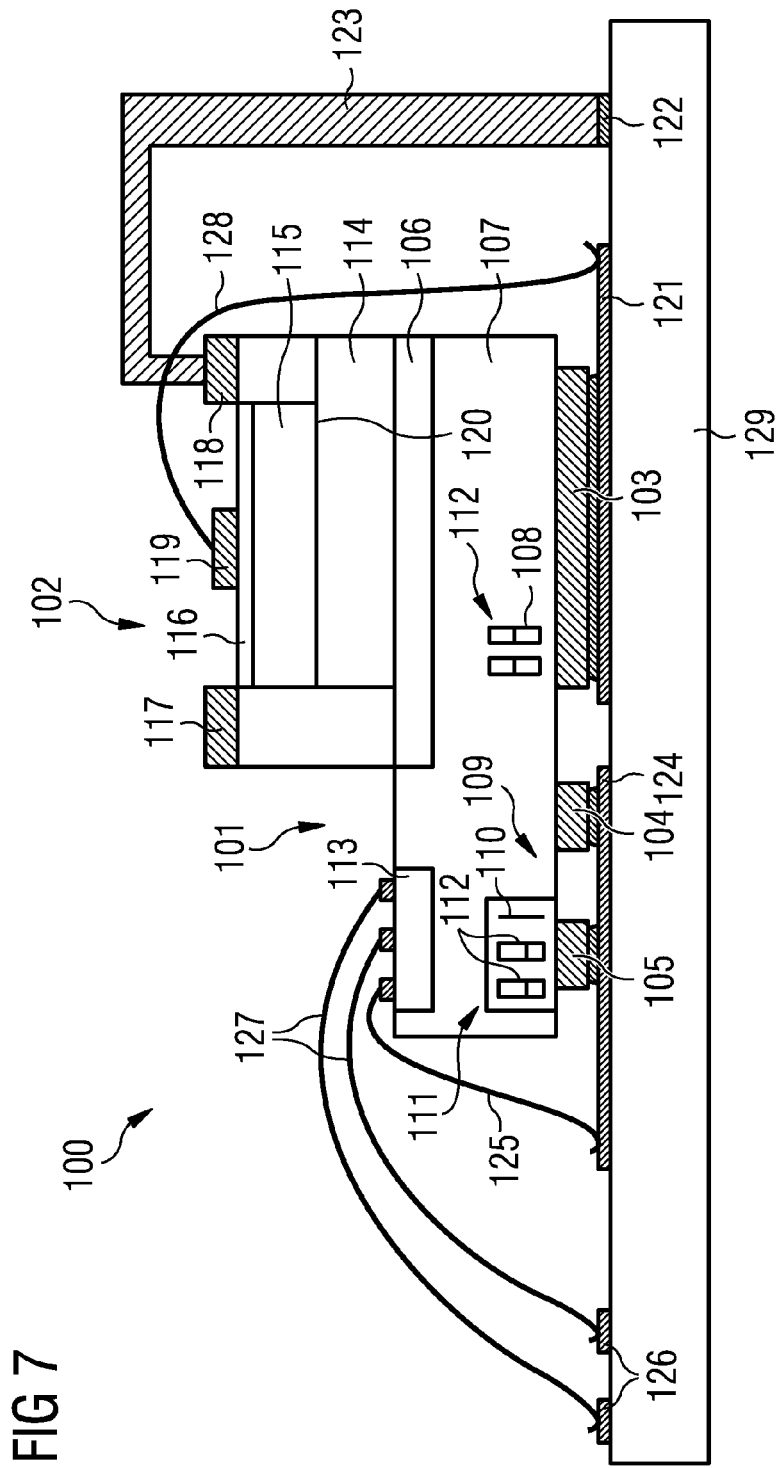
FIG. 7 illustrates a monolithically integrated switching circuit according to an embodiment.

FIG. 7 illustrates a more detailed view of a switching circuit 100 which includes a low voltage enhancement mode transistor 101 which is monolithically integrated with a high-voltage depletion mode transistor 102 and which provides a switching circuit as, for example, illustrated in FIG. 2. The switching circuit 100 may be provided as a single package including a redistribution board or a lead frame providing outer contacts.

The low voltage enhancement mode transistor 101 is a silicon-based MOSFET device including a source pad 103, a gate pad 104 and a sense pad 105 on its lower surface and a drain electrode 106 formed by a highly doped region of the silicon body 107 on its upper surface. The low voltage enhancement mode transistor 101 includes a plurality of transistor cells 112, each including a source electrode 108, within the silicon body 107. The transistor cells 112 are connected in parallel with one another and integrated in the silicon body 107.

The switching circuit 100 includes a current sense circuit 109 for sensing the current flowing through a current sense path 110 which is coupled in parallel with the current path of the switching circuit 100. The current sense circuit 109 includes a current sense element 111 which includes one or a predetermined number of the transistor cells 112 which are coupled in parallel. The sense circuit 109 further includes a sense pad 105 which is coupled to the source electrodes 108 of the transistor cells 112 constituting the current sense element 111.

In some embodiments, the current sense circuit 109 further includes a second current sense pad on the semiconductor substrate or silicon body 107 which is coupled to the source electrodes 108 of the low voltage enhancement mode transistor 101. The second current sense pad is separate from the first current sense pad. In embodiments in which the current sense circuit 109 includes a second current sense pad, the current sense circuit 109 may further include a resistive element coupled between the first current sense pad 105 and the second current sense pad. The switching circuit 100 further includes logic 113 integrated in the semiconductor body 107 for detecting irregularities or a fault in the current path of the switching circuit 100 from the current sensed by the sense circuit 109 in the current sense path 110. If the logic 113 detects that the current flowing in the current sense path 110 has exceeded a predetermined threshold, this may mean that the low voltage enhancement mode transistor 101 and/or the high voltage depletion mode transistor 102 may be about to suffer a fault or is faulting. This information may be used to switch off the switching circuit 100.

The switching circuit 100 further includes a high-voltage depletion mode transistor 102 which is monolithically integrated with the low voltage enhancement mode transistor 101. The high-voltage depletion mode transistor 102 is, in this embodiment, a gallium nitride-based HEMT which includes a gallium nitride layer 114 which is deposited on, and monolithically integrated with, the drain 106 of the low voltage enhancement mode transistor. The silicon body 107 may be considered to provide a semiconductor substrate for the HEMT deposited on top. The high voltage depletion mode transistor 102 further includes an aluminum gallium nitride layer 115 arranged on the gallium nitride layer 114 and a gallium nitride cap layer 116 arranged on the aluminum gallium nitride layer 115.

The high-voltage depletion mode transistor includes a source 117 which extends through the cap layer 116, the aluminum gallium nitride layer 115 and the gallium nitride layer 114 and is arranged on, and electrically coupled with, the drain 106 of the low voltage enhancement mode transistor 101. The high-voltage depletion mode transistor 102 further includes a drain electrode 118 which extends through the cap layer 116 and the aluminum gallium nitride layer 115 and is in contact with the gallium nitride layer 114. The high-voltage depletion mode transistor 102 further includes a gate electrode 119 which is arranged on the cap layer 116 and is laterally positioned between the source electrode 117 and the drain electrode 118. A two-dimensional gas is formed by spontaneous polarization at the interface 120 between the aluminum gallium nitride layer 115 and the gallium nitride layer 114. The gallium nitride layer 114 may be considered to be a channel layer and the aluminum gallium nitride layer 115 may be considered to be a barrier layer.

The switching circuit 100 further includes an electrical connection, for example in the form of a bond wire 128, between the gate electrode 119 of the high-voltage depletion mode transistor 102 and a conductive trace 121 on which the source pad 103 of the low voltage enhancement mode transistor 101 is mounted. Consequently, the gate electrode 119 of the high-voltage depletion mode transistor 102 is electrically coupled to the source 103 of the low voltage enhancement mode transistor 101 in a cascode configuration. The drain electrode 118 of the high voltage depletion mode transistor 102 is electrically coupled to a drain trace 122 by further electrical connection, for example a clip 123.

The low voltage enhancement mode transistor has a source down arrangement so that the source pad 103 is mounted on a trace 122 of the substrate 129, for example by solder, and the gate pad 104 and the sense pad 105 are mounted on a further trace 124 arranged on the substrate 129, for example by solder.

The switching circuit 100 includes a drain node electrically coupled to the drain trace 121, a source node electrically coupled to the trace 120, a gate node electrically coupled to the trace 122 which is coupled to the gate pad 104. The sense pad 105 is coupled to the logic 113 by bond wire 123. The logic 113 is further coupled to two further traces 124, 125 by bond wires 126.

The substrate 129 may be a redistribution board or a lead frame.

As discussed above, the current sense circuit of the switching circuit according to any one of the embodiments described above may be arranged in either the low voltage enhancement mode transistor or in the high-voltage depletion mode transistor. An exemplary current sense circuit arranged in a field effect transistor providing a low voltage enhancement mode transistor 101 may include a current sense circuit as illustrated in FIG. 8.

Figure 8:
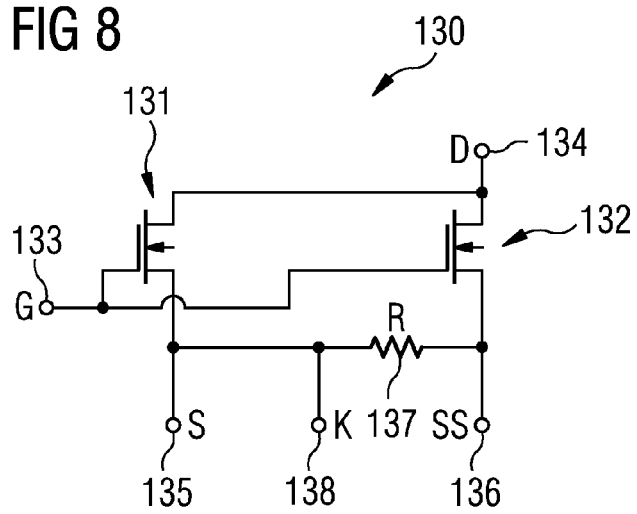
FIG. 8 illustrates a low voltage enhancement mode transistor including a current sense circuit.

The current sense circuit 130 illustrated in FIG. 8 includes a first field effect transistor 131 and a second field effect transistor 132. The field effect transistors 313, 132 may be power MOSFETs, for example. The first MOSFET 131 includes a plurality of transistor cells connected in parallel. A gate, a drain and a source of the first MOSFET 131 are coupled to a gate terminal 133, a drain terminal 134 and a source terminal 135, respectively, of the current sense circuit 130. The second MOSFET 132 is constituted by a single or small number of MOSFET cells connected in parallel. The gate and a drain of the second MOSFET device 132 are coupled to the gate terminal 133 and the drain terminal 134, respectively. The source of the second MOSFET 132 is connected to a sense terminal 136.

The second field effect transistor 132 is smaller than the first field effect transistor 131 in that the number of MOSFET cells connected in parallel is smaller so that the current flow through the second MOSFET 132 is smaller than the current flow through the first MOSFET 131. The second MOSFET 132 is coupled in parallel with the first MOSFET 131. The second MOSFET 132 may be monolithically integrated with the first MOSFET 131. The current sense circuit 130 includes a Kelvin terminal 138 coupled to the source terminal 135. A sense resistor 137 is coupled between the Kelvin terminal 138 and the sense terminal 136.

The potential difference across the resistor 137 may be measured and this potential difference may be used to determine the current flowing through the first field effect transistor 131 if the value of the resistance of the resistor 137 and the ratio of the number of cells constituting the field effect transistor 131 to the number of cells constituting the sensing element provided by the second field effect transistor 132 is known.

Figure 9:
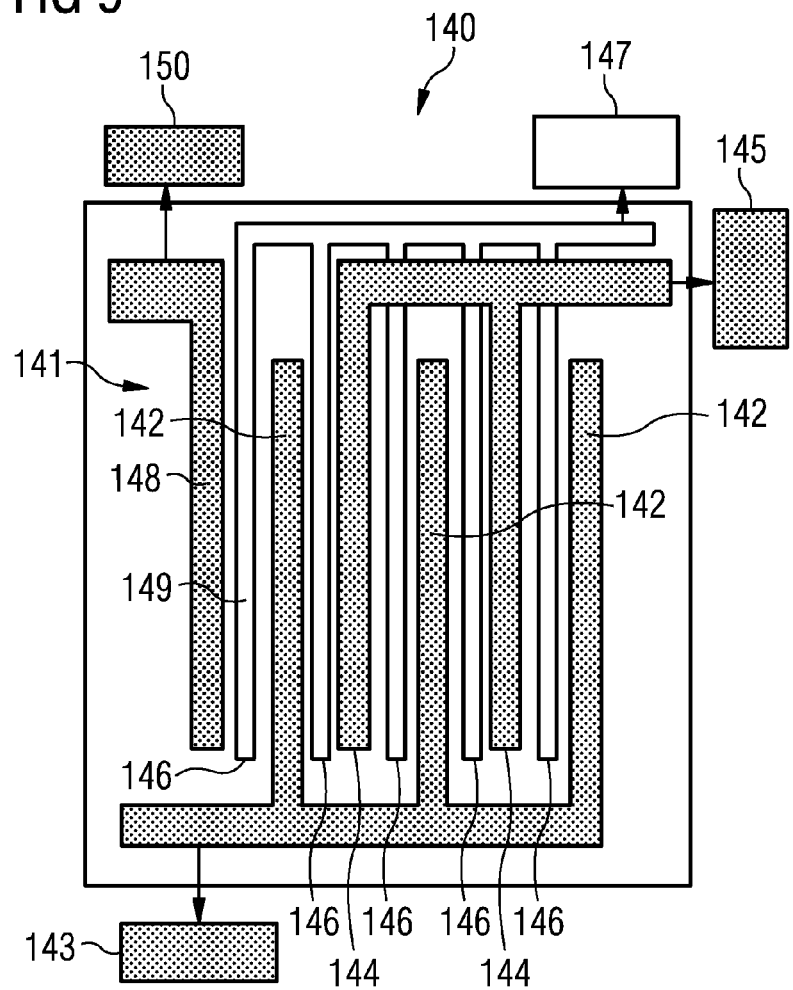
FIG. 9 illustrates a top view of a high-voltage depletion mode transistor including a current sense circuit.

As discussed above, the current sense circuit may also be provided in the high-voltage depletion mode transistor of the switching circuit according to any one of the embodiments described above. FIG. 9 illustrates a top view of a high-voltage depletion mode transistor 140 including a current sense circuit 141 which may be used in one of the switching circuits described above. The high voltage depletion mode transistor 140 may be a gallium nitride-based transistor.

The high-voltage depletion mode transistor 140 includes a plurality of drain electrodes 142 arranged parallel to one another which are electrically coupled to a drain terminal 143. The drain electrodes 142 are interleaved with a plurality of source electrodes 144 also arranged parallel to one another. The source electrodes are electrically coupled to a source terminal 145. A plurality of gate electrodes 146 are arranged such that one gate electrode 146 is positioned between adjacent ones of the drain electrodes 242 and the source electrodes 144. The gate electrodes 146 are electrically coupled to a gate terminal 147.

The high-voltage depletion mode transistor 140 includes a current sense circuit 141 which includes a further sense electrode 148 which is separate from the other electrodes. The sense electrode 148 is positioned adjacent one of the drain electrodes 142 such that one of the gate electrodes 149 is positioned between the drain electrode 142 and the sense electrode 148. The sense electrode 148 is coupled to a sense terminal 150 which is separate from the other terminals. The sense electrode 148 together with the gate electrode 149 and the drain electrode 142 provide a second small transistor which is coupled in parallel with the high-voltage depletion mode transistor 140. This smaller transistor can be used for current sensing.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A switching circuit, comprising:
   input drain, source and gate nodes;
   a high voltage depletion mode transistor comprising a current path coupled in series with a current path of a low voltage enhancement mode transistor; and
   a current sense circuit for sensing the current flowing through a current sense path,
   wherein the high voltage depletion mode transistor is a Group III-Nitride-based transistor.

2. The switching circuit according to claim 1, wherein the current sense circuit is at least partially integrated in the high voltage depletion mode transistor.

3. The switching circuit according to claim 1, wherein the current sense circuit is at least partially integrated in the low voltage enhancement mode transistor.

4. The switching circuit according to claim 1, wherein the current sense circuit comprises a transistor coupled in parallel with the low voltage enhancement mode transistor.

5. The switching circuit according to claim 1, wherein the low voltage enhancement mode transistor comprises a plurality of transistor cells connected in parallel with each other and integrated in a semiconductor substrate.

6. The switching circuit according to claim 5, wherein the current sense circuit comprises a current sense element comprising one of said transistor cells or a predetermined number of said transistor cells coupled in parallel, said transistor cells having source electrodes.

7. The switching circuit according to claim 6, wherein the current sense circuit further comprises a first current sense pad on said semiconductor substrate and coupled to said source electrodes of said transistor cells constituting said current sense element.

8. The switching circuit according to claim 7, wherein the current sense circuit further comprises a second current sense pad on said semiconductor substrate and coupled to said source electrode of said transistor, said second current sense pad being separate from said first current sense pad.

9. The switching circuit according to claim 8, wherein the current sense circuit further comprises a resistive element coupled between said first current sense pad and said second current sense pad.

10. The switching circuit according to claim 1, further comprising at least one current sense node.

11. The switching circuit according to claim 10, further comprising a second current sense node.

12. The switching circuit according to claim 1, wherein the high voltage depletion mode transistor is operatively connected in a cascode arrangement to said low voltage enhancement mode transistor.

13. The switching circuit according to claim 1, wherein the high voltage depletion mode transistor is directly driven.

14. The switching circuit according to claim 1, wherein the high voltage depletion mode transistor is provided as a discrete component and the low voltage enhancement mode transistor is provided as a discrete component.

15. The switching circuit according to claim 1, wherein the high voltage depletion mode transistor and the low voltage enhancement mode transistor are mounted adjacent one another in a composite package.

16. The switching circuit according to claim 1, wherein the high voltage depletion mode transistor and the low voltage enhancement mode transistor are monolithically integrated.

17. The switching circuit according to claim 1, wherein the high voltage depletion mode transistor is a Group III-Nitride-based high electron mobility transistor (HEMT).

18. The switching circuit according to claim 1, wherein the low voltage enhancement mode transistor is an IGFET.

19. The switching circuit according to claim 18, wherein the IGFET is a p-channel MOSFET.

20. A switching circuit, comprising:
input drain, source and gate nodes;
a high voltage depletion mode transistor comprising a current path coupled in series with a current path of a low voltage enhancement mode transistor; and
a current sense circuit for sensing the current flowing through a current sense path,
wherein the low voltage enhancement mode transistor comprises a plurality of transistor cells connected in parallel with each other and integrated in a semiconductor substrate,
wherein the current sense circuit comprises a current sense element comprising one of said transistor cells or a predetermined number of said transistor cells coupled in parallel, said transistor cells having source electrodes,
wherein the current sense circuit further comprises a first current sense pad on said semiconductor substrate and coupled to said source electrodes of said transistor cells constituting said current sense element.

21. The switching circuit according to claim 20, wherein the current sense circuit further comprises a second current sense pad on said semiconductor substrate and coupled to said source electrode of said transistor, said second current sense pad being separate from said first current sense pad.

22. The switching circuit according to claim 21, wherein the current sense circuit further comprises a resistive element coupled between said first current sense pad and said second current sense pad.

23. A switching circuit, comprising:
input drain, source and gate nodes;
a high voltage depletion mode transistor comprising a current path coupled in series with a current path of a low voltage enhancement mode transistor;
a current sense circuit for sensing the current flowing through a current sense path;
a first current sense node; and
a second current sense node.

24. The switching circuit according to claim 23, wherein the high voltage depletion mode transistor is operatively connected in a cascode arrangement to said low voltage enhancement mode transistor.

25. The switching circuit according to claim 23, wherein the high voltage depletion mode transistor is directly driven.

26. The switching circuit according to claim 23, wherein the high voltage depletion mode transistor is provided as a discrete component and the low voltage enhancement mode transistor is provided as a discrete component.

27. The switching circuit according to claim 23, wherein the high voltage depletion mode transistor and the low voltage enhancement mode transistor are mounted adjacent one another in a composite package.

28. The switching circuit according to claim 23, wherein the high voltage depletion mode transistor and the low voltage enhancement mode transistor are monolithically integrated.

29. The switching circuit according to claim 23, wherein the high voltage depletion mode transistor is a Group III-Nitride-based transistor.

* * * * *